(12) United States Patent
Yoshida et al.

(10) Patent No.: US 8,785,942 B2
(45) Date of Patent: Jul. 22, 2014

(54) NITRIDE SEMICONDUCTOR SUBSTRATE AND METHOD OF MANUFACTURING THE SAME

(75) Inventors: Akira Yoshida, Hadano (JP); Jun Komiyama, Hadano (JP); Yoshihisa Abe, Hadano (JP); Hiroshi Oishi, Hadano (JP); Kenichi Eriguchi, Hadano (JP); Shunichi Suzuki, Hadano (JP)

(73) Assignee: Covalent Materials Corporation, Shinagawa-ku, Tokyo (JP)

( * ) Notice: Subject to any disclaimer, the term of this patent is extended or adjusted under 35 U.S.C. 154(b) by 310 days.

(21) Appl. No.: 13/352,987

(22) Filed: Jan. 18, 2012

(65) Prior Publication Data
US 2012/0211763 A1 Aug. 23, 2012

(30) Foreign Application Priority Data

Feb. 22, 2011 (JP) ................................. 2011-035291
Apr. 27, 2011 (JP) ................................. 2011-099031
May 26, 2011 (JP) ................................. 2011-117552
Nov. 14, 2011 (JP) ................................. 2011-248155

(51) Int. Cl.
*H01L 29/15* (2006.01)
(52) U.S. Cl.
USPC ............. 257/76; 257/183; 257/191; 257/192; 257/E21.09; 257/E29.089

(58) Field of Classification Search
None
See application file for complete search history.

(56) References Cited

U.S. PATENT DOCUMENTS

2011/0297957 A1* 12/2011 Kikkawa et al. ................ 257/76
2012/0139038 A1* 6/2012 Imanishi et al. ............. 257/330

FOREIGN PATENT DOCUMENTS

| JP | 2001-196575 A | 7/2001 |
| JP | 2008-10803 A | 1/2008 |
| JP | 2010-123899 A | 6/2010 |

* cited by examiner

*Primary Examiner* — Yasser A Abdelaziez
(74) *Attorney, Agent, or Firm* — Buchanan Ingersoll & Rooney PC

(57) ABSTRACT

A nitride semiconductor substrate suitable for a normally-off type high breakdown-voltage device and a method of manufacturing the substrate are provided allowing both a higher threshold voltage and improvement in current collapse.
In a nitride semiconductor substrate 10 having a substrate 1, a buffer layer 2 formed on one principal plane of the substrate 1, an intermediate layer 3 formed on the buffer layer 2, an electron transport layer 4 formed on the intermediate layer 3, and an electron supply layer 5 formed on the electron transport layer 4, the intermediate layer 3 has a thickness of 200 nm to 1500 nm and a carbon concentration of $5 \times 10^{16}$ atoms/cm$^3$ to $1 \times 10^{18}$ atoms/cm$^3$ and is of $Al_xGa_{1-x}N$ ($0.05 \leq x \leq 0.24$), and the electron transport layer 4 has a thickness of 5 nm to 200 nm and is of $Al_yGa_{1-y}N$ ($0 \leq y \leq 0.04$).

8 Claims, 5 Drawing Sheets

FIG. 4
[Table 1]

| | Sample No. | Intermediate layer 3 Al$_x$Ga$_{1-x}$N | | | Electron transport layer 4 Al$_y$Ga$_{1-y}$N | | Evaluation | | | | Remarks |
|---|---|---|---|---|---|---|---|---|---|---|---|
| | | x | Film thickness (nm) | Carbon concentration (×10$^{17}$ atoms/cm$^3$) | y | Film thickness (nm) | Threshold voltage shift value (V) | Current collapse improvement degree | Withstand voltage | | |
| Experiment 1 | 1 | 0.20 | 1000 | 1 | 0 | 100 | 3.0 | Good | 700V (Total thickness 4 μm) (Reference) | | Intermediate layer 3 film-forming temperature 1000°C |
| | 2 | 0 | 1000 | 500 | 0 | 100 | 0 (Reference) | Good | Good (Reference) | | Intermediate layer 3 film-forming temperature 900°C |
| | 3 | 0.04 | | | | | 1.5 | Good | Good | | |
| | 4 | 0.05 | | | | | 2.5 | Good | Good | | AlGaN(002) half-value width: 430 |
| | 5 | 0.14 | 1000 | 1 | 0 | 100 | 3.0 | Good | Good | | |
| | 6 | 0.20 | | | | | 3.0 | Good | Good | | |
| | 7 | 0.23 | | | | | 3.0 | Good | Good | | |
| | 8 | 0.24 | | | | | 3.0 | Good | Good | | |
| | 9 | 0.25 | | | | | 3.0 | Reduced | Reduced | | |
| | 10 | | 100 | | | | 3.0 | Reduced | Good | | |
| | 11 | | 200 | | | | 3.0 | Good | Good | | |
| | 12 | 0.20 | 1200 | 1 | 0 | 100 | 3.0 | Good | Good | | AlGaN(002) half-value width: 420 seconds |
| | 13 | | 1500 | | | | 3.0 | Good | Good | | |
| | 14 | | 2000 | | | | 3.0 | Good | Reduced | | |
| Experiment 2 | 15 | | | 0.1 | | | 3.0 | Good | Reduced | | |
| | 16 | | | 0.5 | | | 3.0 | Good | Good | | |
| | 17 | 0.20 | 1000 | 1.2 | 0 | 100 | 3.0 | Good | Good | | |
| | 18 | | | 10 | | | 3.0 | Good | Good | | |
| | 19 | | | 20 | | | 3.0 | Reduced | Good | | |
| | 20 | | | | 0.005 | | 3.0 | Good | Good | | |
| | 21 | 0.20 | 1000 | 1 | 0.01 | 100 | 3.0 | Good | Good | | |
| | 22 | | | | 0.02 | | 3.0 | Good | Good | | |
| | 23 | | | | 0.03 | | 3.0 | Good | Good | | Mobility Reduced |
| | 24 | | | | | 3 | 3.0 | Good | Good | | Resistance of device increases |
| | 25 | | | | | 5 | 3.0 | Good | Good | | |
| | 26 | 0.20 | 1000 | 1 | 0 | 20 | 3.0 | Good | Good | | |
| | 27 | | | | | 70 | 3.0 | Good | Good | | |
| | 28 | | | | | 120 | 2.2 | Good | Good | | |
| | 29 | | | | | 250 | 1.5 | Good | Good | | |
| Experiment 3 | 30 | 0.20 | 1000 | 1 | 0 | 100 | 3.0 | Good | Good | | Intermediate layer 3 film-forming temperature 1000°C |
| | 31 | 0.20 | 1000 | 1 | 0 | 100 | 3.0 | Good | Good | | Substrate 1 Si (111) |
| | 32 | | 1000 | 500 | 0 | 100 | 0 (Reference) | Good | Good (Reference) | | Intermediate layer 3 film-forming temperature 900°C |

FIG. 5
[Table 2]

|  | Sample No. | Intermediate layer 3 $Al_xGa_{1-x}N$ Film forming temperature(°C) | Evaluation | | | Reference |
|---|---|---|---|---|---|---|
|  |  |  | Threshold voltage shift value(V) | Current collapse improvement degree | Withstand voltage 700V (Total thickness 4 μm) (Reference) | AlGaN(002) half-value width: 450 seconds |
| Experiment 1 | 1 | 1000 | 3.0 | Good | Good |  |
|  | 2 | 900 | 0 (Reference) | Good | Good |  |
| Experiment 4 | 33 | 930 | 1.5 | Very bad | Good |  |
|  | 34 | 950 | 1.5 | Reduced | Good |  |
|  | 35 | 970 | 3.0 | Good | Good |  |
|  | 36 | 1100 | 3.0 | Good | Good |  |
|  | 37 | 1250 | 3.0 | Good | Good |  |
|  | 38 | 1300 | 3.0 | Good | Reduced |  | ly of the invention in a preferred embodiment of the present invention.

NITRIDE SEMICONDUCTOR SUBSTRATE AND METHOD OF MANUFACTURING THE SAME

BACKGROUND OF THE INVENTION

1. Field of the Invention

The present invention relates to a nitride semiconductor substrate for a nitride semiconductor suitable as a high speed and high breakdown-voltage electron device.

2. Description of the Related Art

Nitride semiconductors, such as gallium nitride (GaN), aluminum nitride (AlN), etc., have outstanding properties, such as high electron mobility, high heat resistance, etc., and therefore can suitably be applied to a high electron mobility transistor (HEMT: High Electron Mobility Transistor), a heterojunction field effect transistor (HFET: Heterojunction Field Effect Transistor), for example.

In particular, there is an increasing demand for improvement in various electrical properties in a normally-off type HEMT structure in which a nitride semiconductor is used. In order to cope with this demand, several technologies are known.

For example, Japanese Patent Application Publication No. 2001-196575 discloses a technology in which, in order to reduce a leak current component caused by conduction of the remaining carrier in a buffer layer of GaN and to raise a pinch off property of a transistor in a GaN field-effect transistor, an AlGaN layer is provided in the GaN buffer layer of a heterostructure in which the GaN buffer layer, a channel layer of GaN or a combination of InGaN and GaN, and an AlGaN layer are formed one by one on a sapphire substrate or a SiC substrate, and an AlN content in the AlGaN layer is smaller than an AM content in the AlGaN layer at the surface.

Further, Japanese Patent Application Publication No. 2008-010803 discloses a nitride semiconductor field-effect transistor technology in which, an $Al_xGa_{1-x}N$ layer, a GaN layer, and a $Al_yGa_{1-y}N$ layer are stacked in this order in the +c direction of crystal orientation for the purpose of obtaining enhancement type operation capable of controlling the threshold voltage, and a gate portion has a channel of a double heterostructure, where depletion takes place when x≤y.

Furthermore, as a field effect transistor which can control the current collapse, Japanese Patent Application Publication No. 2010-123899 discloses a HEMT structure in which a first nitride semiconductor layer consisting of a first nitride semiconductor and a second nitride semiconductor layer which is formed on the first nitride semiconductor layer and consists of a second nitride semiconductor having a larger band gap than the first nitride semiconductor are provided, and the first nitride semiconductor layer has an area whose penetration dislocation density increases in the stacking direction.

Incidentally, in recent years, there has been a need for improvement in the threshold voltage and improvement in the current collapse in a normally-off type heterojunction field effect transistor.

SUMMARY OF THE INVENTION

On the other hand, the technology described in JP-A No. 2001-196575 is effective in improvement in a pinch off property, but it is not necessarily sufficient in respect of improvement in the threshold voltage and current collapse.

Further, although JP-A No. 2008-010803 discloses that the technology can control the threshold voltage, it still does not sufficiently correspond to a need for obtaining a higher threshold voltage.

Furthermore, the technology described in JP-A No. 2010-123899 can control the current collapse, but it is not sufficient in respect of the improvement in the threshold voltage.

The present invention arises in view of such technical problems and aims at providing a nitride semiconductor substrate which allows both a higher threshold voltage and current collapse improvement and is suitable for a normally-off type high breakdown voltage device, and a method of manufacturing the substrate.

The nitride semiconductor substrate in accordance with the present invention is a nitride semiconductor substrate having a substrate, a buffer layer formed on one principal plane of the above-mentioned substrate, an intermediate layer formed on the above-mentioned buffer layer, an electron transport layer formed on the above-mentioned intermediate layer, and an electron supply layer formed on the above-mentioned electron transport layer, wherein the above-mentioned intermediate layer has a thickness of 200 nm to 1500 nm and a carbon concentration of $5\times10^{16}$ atoms/cm$^3$ to $1\times10^{18}$ atoms/cm$^3$ and is of $Al_xGa_{1-x}N$ (0.05≤x≤0.24), and the above-mentioned electron transport layer has a thickness of 5 nm to 200 nm and is of $Al_yGa_{1-y}N$ (0≤y≤0.04).

Such a structure provides a nitride semiconductor substrate which allows both the higher threshold voltage and current collapse improvement and is suitable for a normally-off type high breakdown voltage device.

Further, as for the nitride semiconductor substrate in accordance with the present invention, it is preferable that AlN spacer layers are respectively interposed between the above-mentioned intermediate layer and the above-mentioned electron transport layer and between the above-mentioned electron transport layer and the above-mentioned electron supply layer.

Furthermore, preferably, the above-mentioned buffer layer consists of an initial buffer layer and repeatedly deposited layers formed on the above-mentioned initial buffer layer, the above-mentioned initial buffer layer is such that an AlN layer and an $Al_zGa_{1-z}N$ (0≤z≤1) layer are stacked in this order, the above-mentioned repeatedly deposited layers are such that GaN layers and AlN layers are repeatedly stacked in this order a plurality of times, another GaN layer is further formed to have one set of composite layers, and a plurality of sets are stacked.

The preferred method of manufacturing the nitride semiconductor substrate in accordance with the present invention is a method of manufacturing a nitride semiconductor substrate using a vapor deposition process, wherein a temperature at the time of forming the above-mentioned intermediate layer on the above-mentioned buffer layer is 970° C. to 1250° C.

In the nitride semiconductor substrate in accordance with the present invention, comprises the intermediate layer between the buffer layer and the electron transport layer, thereby providing the nitride semiconductor substrate which allows both the higher threshold voltage and current collapse improvement and is suitable for the normally-off type high breakdown voltage device.

BRIEF DESCRIPTION OF THE DRAWINGS

FIG. 4 is a table showing fabrication conditions and the evaluation results of Samples 1-32.

FIG. 5 is a table showing fabrication conditions and the evaluation results of Samples 1, 2 and 33-38.

DESCRIPTION OF THE PREFERRED EMBODIMENTS

Hereinafter, the preferred embodiments of the present invention will be described in detail with reference to the drawings.

Figure 1:
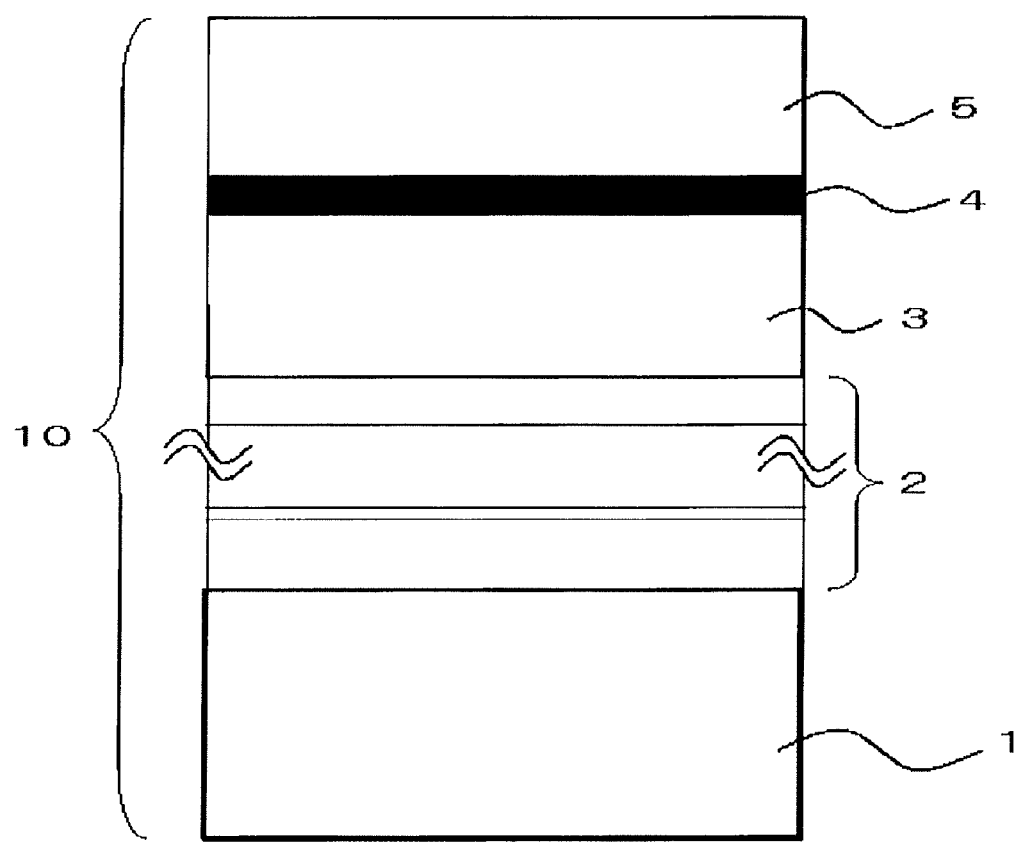
FIG. 1 is a schematic section of a nitride semiconductor substrate in accordance with a preferred embodiment of the present invention.

FIG. 1 is a schematic section of a nitride semiconductor substrate in accordance with a preferred embodiment of the present invention.

A nitride semiconductor substrate 10 in accordance with the present invention is the nitride semiconductor substrate 10 having a substrate 1, a buffer layer 2 formed on one principal plane of the above-mentioned substrate 1, an intermediate layer 3 formed on the buffer layer 2, an electron transport layer 4 formed on the intermediate layer 3, and an electron supply layer 5 formed on the electron transport layer 4 in which the intermediate layer 3 has a thickness of 200 nm to 1500 nm and a carbon concentration of $5\times10^{16}$ atoms/cm$^3$ to $1\times10^{18}$ atoms/cm$^3$ and is of $Al_xGa_{1-x}N$ ($0.05 \leq x \leq 0.24$), and the electron transport layer 4 has a thickness of 5 nm to 200 nm and is of $Al_yGa_{1-y}N$ ($0 \leq y \leq 0.04$).

Various types of single crystal materials manufactured by well-known technologies can be used for the substrate 1 as a base substrate for forming the nitride semiconductor. As example of the materials, there may be mentioned silicon (Si), silicon carbide (SiC), sapphire ($Al_2O_3$), and gallium nitride (GaN).

The substrate 1 is advantageous, since a Si single crystal substrate can be obtained easily. For example, a single crystal manufactured by the Czochralski process (CZ process) or a floating zone process (FZ process) or a substrate produced by various processes, such as a vapor deposition process, a lamination process, etc., may be applied. Furthermore, in view of properties affecting the nitride semiconductor substrate, it may be used after controlling suitably a thickness of the Si single crystal substrate, a surface state, concentration and distribution of dopants, such as oxygen, nitrogen, carbon, phosphorus, boron, etc., contained in the substrate, and various crystal defects.

The buffer layer 2 is formed on the one principal plane of the substrate 1. In the case where the Si single crystal is applied to the substrate 1, lattice constants and thermal expansion coefficients of Si and the nitride semiconductor are different, to thereby cause crystal defects, such as considerable curvature, a crack, a slip, etc. in the nitride semiconductor substrate 10. In order to prevent these, the buffer layer 2 is formed between the substrate 1 and the nitride semiconductor layer which form a device.

For the buffer layer 2, the optimal structure and material may suitably be chosen based on the use and required specification of the nitride semiconductor substrate 10 to be produced. In the present invention, various types of nitride semiconductors may be used, for example. Or, a stack structure of the nitride semiconductor having at least one layer of nitride semiconductors containing Al may be used, since a high substrate property can be obtained readily.

Figure 3:
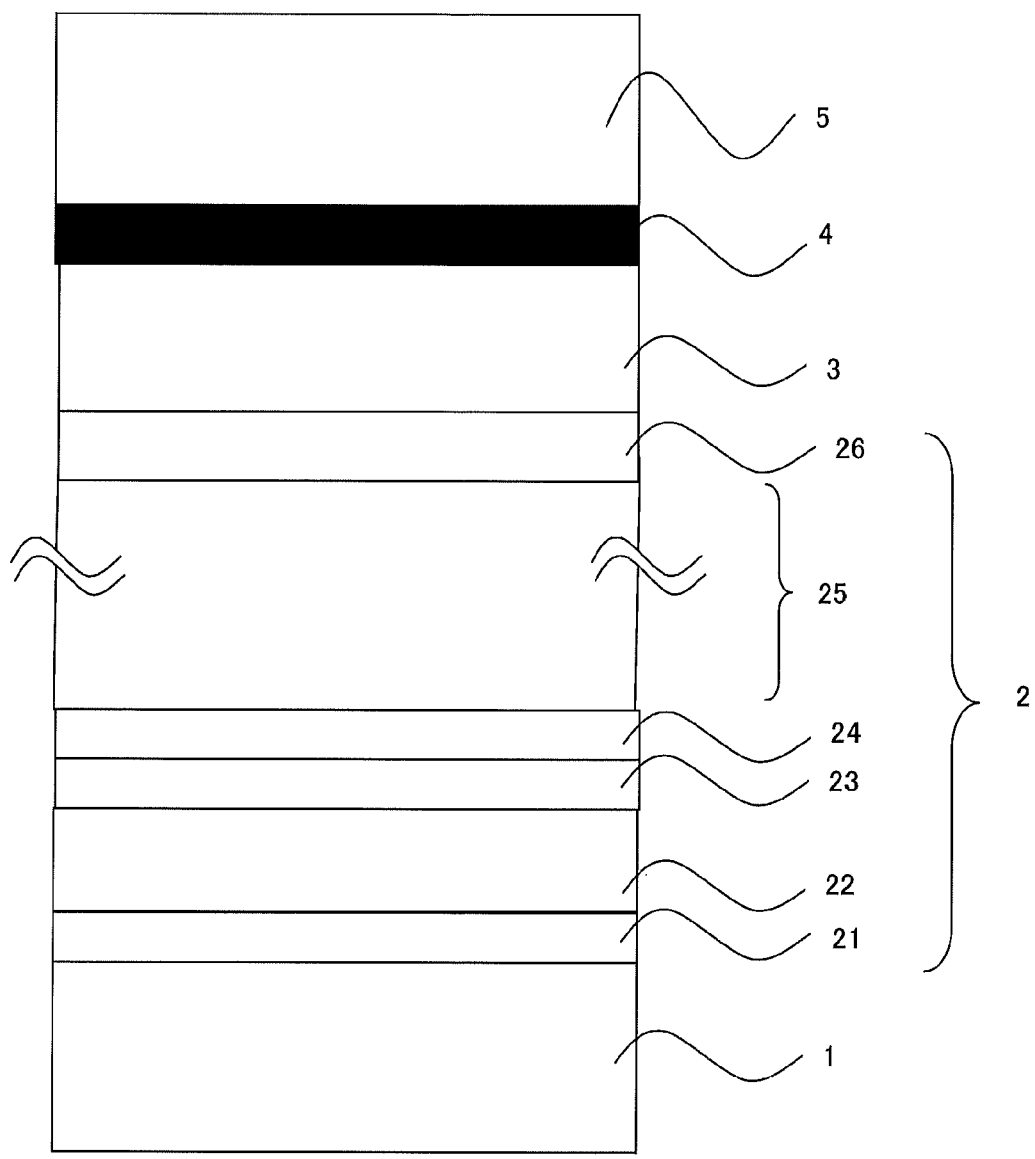
FIG. 3 is a schematic section of a nitride semiconductor substrate in accordance with another preferred embodiment of the present invention.

FIG. 3 shows a schematic section of the nitride semiconductor substrate having a preferable embodiment of buffer layer. As shown in FIG. 3, it is especially preferable that the structure of the buffer layer 2 has an initial buffer layer 21 in which an AlN layer 211 and an $Al_zGa_{1-z}N$ ($0 \leq z \leq 1$) layer 212 are stacked in this order, and repeatedly deposited layers 22 formed on the above-mentioned initial buffer layer 21. The above-mentioned repeatedly deposited layers 22 are such that the GaN layers 221 and the AlN layers 222 are repeatedly stacked in this order a plurality of times, another GaN layer 223 is further formed to have one set of composite layers 220, and a plurality of sets are stacked.

The intermediate layer which serves to improve a property is formed on the buffer layer 2, and the electron transport layer 4 is formed on this intermediate layer 3. Furthermore, the electron supply layer 5 is formed thereon. This structure is similar to substrate structures of a well-known HEMT etc. In this way, the nitride semiconductor substrate 10 in accordance with one embodiment of the present invention is formed.

The intermediate layer 3 has a thickness of 200 nm to 1500 nm and a carbon concentration of $5\times10^{16}$ atoms/cm$^3$ to $1\times10^{18}$ atoms/cm$^3$, and is of $Al_xGa_{1-x}N$ ($0.05 \leq x \leq 0.24$).

Generally, a method of raising a threshold voltage may be an increase in energy difference between a conduction band and the Fermi level in the intermediate layer 3 formed between the buffer layer 2 and the electron transport layer 4. In order to cope with this, it is necessary to reduce an electron density in the intermediate layer 3. As an example of the reduction, there may be mentioned a method of preventing generation of a defect in the intermediate layer 3.

In the case where $Al_xGa_{1-x}N$ is used for the intermediate layer 3, a certain amount of film thickness is needed for realizing a normally-off state. Incidentally, $Al_xGa_{1-x}N$ itself is a material which tends to cause a defect when it is formed as a film by a vapor deposition process. For this reason, the electrons contained in the layer formed as a film increase and the Fermi level becomes high. Furthermore, as the film thickness is increased, an amount of electrons contained in the layer formed as a film increases in proportion to this thickness, so that improvement in the threshold voltage cannot be expected.

Then, a thickness of the intermediate layer 3 is set to 200 nm to 1500 nm in the present invention. Preferably, it is from 800 nm to 1200 nm.

A film thickness of less than 200 nm is so insufficient as to provide an amount of electrons allowing the effect of the present invention, this is not preferred. On the other hand, if it exceeds 1500 nm, a breakdown voltage falls; this is not preferred, either.

A carbon concentration in the intermediate layer 3 is preferably from $5\times10^{16}$ atoms/cm$^3$ to $1\times10^{18}$ atoms/cm$^3$. More preferably, it is from $1\times10^{17}$ atoms/cm$^3$ to $5\times10^{17}$ atoms/cm$^3$.

Here, the carbon concentrations are represented by averages measured in the thickness direction of the substrate by way of known concentration measuring methods, such as a spreading resistance (SR) measuring method and the secondary ion mass spectrometry (SIMS) method. Further, unless otherwise stated, it is represented by a value measured at one point in the center of the one principal plane of the substrate. However, it is possible to use values measured at multiple points in the one principal plane of the substrate if necessary.

Carbon included suitably in the intermediate layer 3 has the effects of preventing the rise of the Fermi level caused by a defect and of raising a conduction band of the electron transport layer 4 which is formed directly on the intermediate layer 3.

However, at a carbon concentration of less than $5\times10^{16}$ atoms/cm$^3$, the sufficient effect of raising the conduction band is not obtained. While, at a concentration of higher than $1\times10^{18}$ atoms/cm$^3$, there is concern that the high carbon concentration may worsen the collapse property. Therefore, neither is preferred.

It should be noted that a half-value width of an X-ray rocking curve of the intermediate layer 3 in accordance with the present invention is preferably 600 seconds or less at AlGaN (002) plane. When the half-value width of the X-ray rocking curve exceeds 600 seconds, there is concern that improvement in a threshold is inhibited since the crystallinity of the intermediate layer 3 is low.

Further, it is preferable that x of $Al_xGa_{1-x}N$ in the intermediate layer 3 is from 0.05 to 0.24. More preferably, it is from 0.15 to 0.23.

If x of $Al_xGa_{1-x}N$ is small, i.e. an Al content is too small, then an amount of shift of the threshold voltage becomes small, this is not preferred. On the other hand, if the Al content is too large, then the collapse property is worsened, this is not preferred, either.

It should be noted that the intermediate layer 3 may be of not only a single layer having an $Al_xGa_{1-x}N$ composition but also a multilayer structure consisting of a plurality of $Al_xGa_{1-x}N$ layers where Al contents x are different. Furthermore, Al concentrations may be arranged to change (i.e. increase or decrease) uniformly in the thickness direction.

The electron transport layer 4 located directly on the intermediate layer 3 has a thickness of 5 nm to 200 nm and is of $Al_yGa_{1-y}N$ ($0 \leq y \leq 0.04$).

Preferably, a thickness of the electron transport layer 4 is from 5 nm to 200 nm. More preferably, it is from 10 nm to 150 nm.

In the case where a thickness of the electron transport layer 4 is less than 5 nm, it is so thin a film as to form a uniform film generally. Thus, there is concern that the property may be worsened because of uneven film thickness, this is not preferred. On the other hand, if the thickness exceeds 200 nm, the sufficient effect of raising the conduction band is not obtained, thus reducing the effect of improving the threshold voltage. This is not preferred, either.

Further, in the case where the Al content of the electron transport layer 4 is of $Al_yFa_{1-y}N$, y is preferably from 0 to 0.04. More preferably it is of GaN where y=0. A greater Al content is not preferred, since there is concern that the electron mobility may decrease.

It should be noted that the carbon concentration of the electron transport layer 4 is not particularly limited, however, it is preferably from $5\times10^{16}$ atoms/cm$^3$ to $1\times10^{18}$ atoms/cm$^3$. More preferably, it is from $1\times10^{17}$ atoms/cm$^3$ to $5\times10^{17}$ atoms/cm$^3$.

The high carbon concentration prevents the rise of the Fermi level caused by a defect. As an example, it is effective in raising the conduction band of the GaN layer formed as the electron transport layer 4.

However, a carbon concentration of less than $5\times10^{16}$ atoms/cm$^3$ does not allow the sufficient effects of preventing the rise of the Fermi level caused by a defect and of raising the conduction band of the GaN layer formed as the electron transport layer, this is not preferred. On the other hand, at a concentration of higher than $1\times10^{18}$ atoms/cm$^3$, there is concern that the high carbon concentration may worsen the collapse property. This is not preferred, either.

Further, the electron supply layer 5 is formed on the electron transport layer 4. In the nitride semiconductor substrate in accordance with one preferred embodiment of the present invention, the electron supply layer 5 may be formed using a layer which has a normally-off type HEMT structure and is of various types of materials and compositions. As a material of the electron supply layer 5, a nitride semiconductor is preferred. As an example, AlGaN which has an arbitrary Al content may be applied.

Thus, the nitride semiconductor substrate 10 in accordance with one preferred embodiment of the present invention consists of the optimal combination of the film thickness and carbon concentration of the intermediate layer 3 and the film thickness and composition of the electron transport layer 4 which is in contact with the intermediate layer 3, to thereby attain the high threshold voltage which is not conventional.

Figure 2:
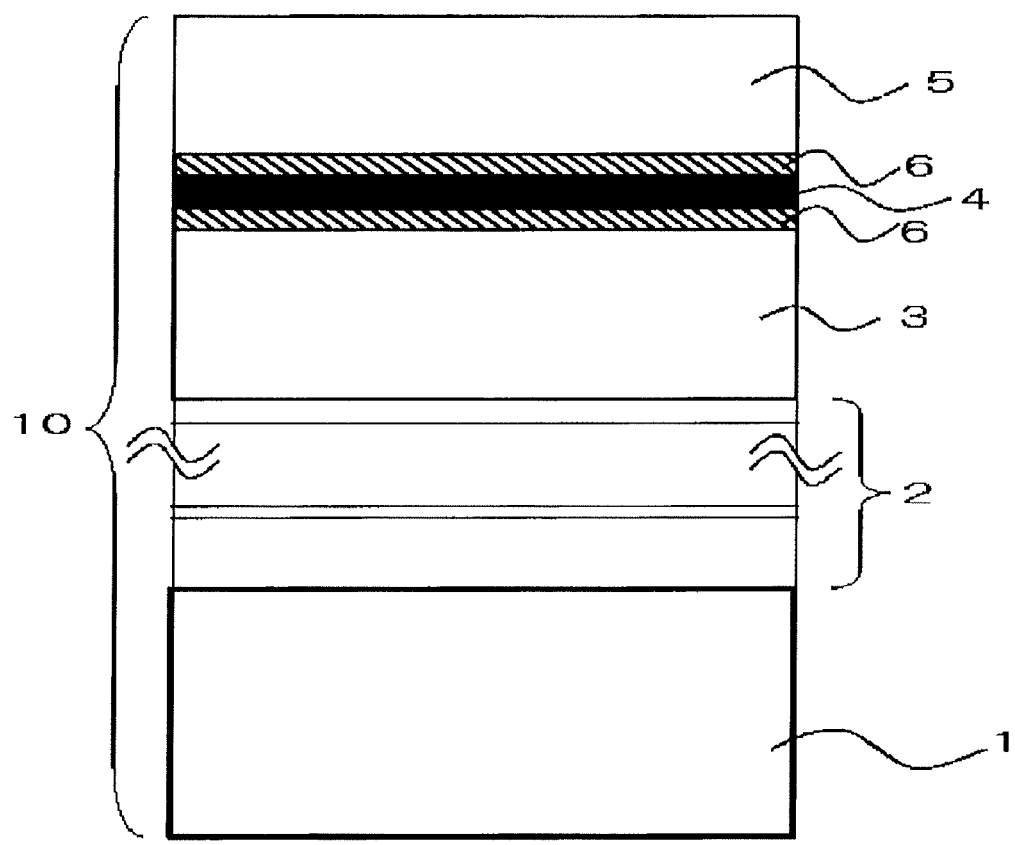
FIG. 2 is a schematic section of a nitride semiconductor substrate in accordance with another preferred embodiment of the present invention.

FIG. 2 shows a schematic section of the nitride semiconductor substrate in accordance with another preferred embodiment of the present invention.

As shown in FIG. 2, in the nitride semiconductor substrate 10 in accordance with another preferred embodiment of the present invention, AlN spacer layers 6 may further be interposed respectively between the intermediate layer 3 and the electron transport layer 4 and between the electron transport layer 4 and the electron supply layer 5.

The AlN spacer layer 6 mainly provides the effect of increasing the shift of the threshold voltage. In the present invention, in a situation where the intermediate layer 3 exists directly under the electron transport layer 4, the AlN spacer layers 6 exist to sandwich the electron transport layer 4, thus exerting the effect of increasing the shift of the threshold voltage further.

It should be noted that a film thickness of the AlN spacer layer 6 is preferably from 0.2 nm to 2 nm. A film thickness of less than 0.2 nm worsens film thickness controllability, and this is not preferred. If it exceeds 2 nm, there is concern that the electron mobility may be worsened. This is not preferred, either.

Here, it is preferable that the AlN spacer layers 6 are respectively interposed between the intermediate layer 3 and the electron transport layer 4 and between the electron transport layer 4 and the electron supply layer 5. This is because there is a possibility that only one of them may not provide the sufficient effect of increasing the shift of the threshold voltage.

Further, a suitable method of manufacturing the nitride semiconductor substrate 10 in accordance with the present invention includes the steps of forming the buffer layer 2 on the one principal plane of the substrate 1 using a vapor deposition process, forming the intermediate layer 3 on the buffer layer 2, forming the electron transport layer 4 on the intermediate layer 3, and forming the electron supply layer 5 on the electron transport layer 4, and a temperature at the time of forming the above-mentioned intermediate layer 3 is from 970° C. to 1250° C.

As for the nitride semiconductor substrate 10, the buffer layer 2, the intermediate layer 3, the electron transport layer 4, and the electron supply layer 5 are formed one by one by a vapor deposition process on the one principal plane, such as a Si substrate etc. Although a well-known method conventionally used in the manufacture of a semiconductor substrate may be applied to the vapor deposition process, a metalorganic chemical vapor deposition (MOCVD) method is used preferably.

As for the intermediate layer 3, by optimizing its crystallinity and film thickness as well as the carbon concentration, it is possible to improve the threshold remarkably. Especially, as for the crystallinity control, the precise control may be carried out with its film forming temperature, when a vapor deposition process is applied.

It should be noted that in the case where a vapor deposition process, especially the MOCVD method is used, a source of carbon is included in the materials used for the MOCVD method, so that the carbon concentration can also be adjusted by controlling precisely the growth temperature, a material supply flow rate, growth time, etc., for the purpose of optimization.

If a film forming temperature of the intermediate layer 3 is less than 970° C., necessary crystallinity cannot be obtained, this is not preferred. On the other hand, if it exceeds 1250° C., a uniform growth rate cannot be obtained and it degrades film thickness homogeneity or worsens Al concentration controllability, this is not preferred, either. Preferably, it is from 980° C. to 1030° C.

It should be noted that a growth temperature for each layer, except for the intermediate layer 3, is not necessarily limited but it may be suitably adjusted according to the required properties of the nitride semiconductor substrate.

In the nitride semiconductor substrate 10 in accordance with one preferred embodiment of the present invention, the substrate 1, the buffer layer 2, the intermediate layer 3, the electron transport layer 4, and the electron supply layer 5 are essential components. One or more layers suitably consisting of various types of nitride semiconductors may be added between the substrate 1 and the buffer layer 2 or onto the electron supply layer 5 as required or in order to add various types of properties.

As described above, the present invention can provide a nitride semiconductor substrate which allows both a higher threshold voltage and current collapse improvement and is suitable for a normally-off type high breakdown-voltage device, and a suitable method of manufacturing the substrate.

Further, the nitride semiconductor substrate 10 in accordance with the present invention is advantageous in that the effect of improving the threshold voltage can be obtained by combining the structure having a smaller number of layers than before and the growth temperature control technique which allows simple and precise control.

Hereinafter, the preferred embodiments of the present invention will be described with reference to examples; however, the present invention is not limited thereto.

Experiment 1

A nitride semiconductor substrate 10 having a layer structure as shown in FIG. 1 was fabricated according to the following processes. As a common manufacture method, the substrate 1 made of a Si single crystal with a diameter of 3 inches, an n dopant type, a thickness of 625 μm, and a plane direction (100) was placed in an MOCVD apparatus. As materials for the nitride semiconductor, trimethyl gallium (TMG), trimethyl aluminum (TMA), ammonia (NH$_3$), and methane (CH$_4$) were used. According to the layer to, be formed, these materials were used selectively and suitably, and a vapor deposition temperature was raised to 1000° C. to form each layer. In addition, composition and adjustment of a thickness of each layer were achieved by selection of the materials and adjustment of a flow rate, pressure, and supply time.

An AlN single crystal layer was formed on the substrate 1 to have a carbon concentration of $5\times10^{19}$ atoms/cm$^3$ and a thickness of 20 nm. Subsequently, an Al$_{0.2}$Ga$_{0.8}$N single crystal layer was stacked to have a carbon concentration of $5\times10^{19}$ atoms/cm$^3$ and a thickness of 80 nm. These operations were repeated alternately by way of the similar process to form the buffer layers 2 in which a total of 20 layers including ten layers for each were stacked.

The intermediate layer 3 of a single layer was formed on this buffer layer 2 at a vapor deposition temperature of 1000° C. to have a thickness of 1000 nm, an Al$_x$Ga$_{1-x}$N (x=0.20) composition, and a carbon concentration of $1\times10^{17}$ atoms/cm$^3$. Subsequently, the electron transport layer 4 of a GaN single crystal layer was formed to have a thickness of 100 nm and a carbon concentration of $1\times10^{17}$ atoms/cm$^3$. Furthermore, the electron supply layer 5 of an Al$_{0.25}$Ga$_{0.75}$N single crystal was formed to have a thickness of 30 nm and a carbon concentration of $5\times10^{17}$ atoms/cm$^3$. Thus, the nitride semiconductor substrate 10 of Sample 1 was obtained.

Further, the nitride semiconductor layer of a single layer as the intermediate layer 3 was deposited at a vapor deposition temperature of 900° C. to have a thickness of 1000 nm, an Al$_x$Ga$_{1-x}$N (x=0) composition, and a carbon concentration of $1\times10^{17}$ atoms/cm$^3$ for comparison. Except these, operations similar to those for Sample 1 were carried out to obtain Sample 2.

Threshold voltages and current collapse of the nitride semiconductor substrates 10 in Samples 1 and 2 were each measured and evaluated for comparison. Fabrication conditions and evaluation results are shown in the following table 1.

Measurements of the threshold voltages were carried out such that Schottky electrodes (Ni/Au) of recess gates and ohmic electrodes (Ti/Al) as sources and drains were formed on the electron supply layers 5 of the respectively formed nitride semiconductor substrates 10, element separation was carried out, and I-V measurement was performed by a curve tracer at room temperature after forming devices of electric field effect type transistors.

Voltage values show how much the threshold voltages shifted, when one in Sample 2 was set to 0V which was reference voltage.

In order to evaluate improvement in the current collapse, the collapse measurement by current measurement before and after applying stress voltage between electrodes was used. Further, by way the SIMS method, the carbon concentration was measured at one point in the center of the principal plane of the substrate.

As a result, a shift value of the threshold voltage of Sample 1 was 3.0V. Thus, it was confirmed that provision of the structure in accordance with the present invention improved the threshold voltage compared with conventional one. Further, it can be seen that the current collapse improvement effect in Sample 1 is also better than that in Sample 2.

Experiment 2

The Al content, the film thickness, and the carbon concentration of the intermediate layer 3 and the film thickness and the carbon concentration of the electron transport layer 4 were changed. Except for these, the nitride semiconductor substrate 10 was fabricated similarly to Sample 1 and evaluated.

Fabrication conditions and evaluation results are shown in the following table 1. In addition, of properties other than the above-mentioned two evaluation criteria, those changed somewhat are listed in the remarks column. Further, as for several samples, X-ray rocking curve half-value widths are listed for reference.

The breakdown voltages were evaluated using the curve tracer. One that was 150V per micrometer or more was judged to be "good" on the basis of the breakdown voltage value in Sample 1, and one that was less than it was judged to be "reduced".

Further, as for the current collapse, compared with Sample 1, in the case where the current value after applying the stress voltage was equal to or greater than one half of the current value before applying it, the current collapse was judged to be "good". In the case where it was less than one half, the current collapse was judged to be "reduced.

Experiment 3

The buffer layer 2 was arranged to have a structure as set forth below. Except this, the nitride semiconductor substrate 10 was fabricated similarly to Sample 1 to obtain Sample 30.

The buffer layer 2 in Sample 30 was provided with an initial buffer layer and repeatedly deposited layers. First, as an initial buffer layer, an AlN single crystal layer was stacked to have a thickness of 100 nm, and an $Al_{0.1}Ga_{0.9}N$ single crystal layer was stacked to have a thickness of 200 nm. Then, as the repeatedly deposited layers, a GaN single crystal layer was formed to have a thickness of 25 nm; subsequently an AlN single crystal layer was stacked to have a thickness of 5 nm. After repeating these operations alternately by way of the similar process to stack a total of 12 layers including six layers each, another GaN layer was formed to have a thickness of 220 nm. Assuming these to be one set of composite layers, six sets were repeatedly stacked.

Further, in Sample 30, the plane direction (100) of the substrate 1 made of a Si single crystal was changed into (111). Except this, similarly to Sample 30, the nitride semiconductor substrate 10 was fabricated to obtain Sample 31.

Furthermore, the structure of the buffer layer 2 was arranged to be similar to that in Sample 30. Except this, similarly to Sample 2, the nitride semiconductor substrate 10 was fabricated to obtain Sample 32.

For the nitride semiconductor substrates 10 in Samples 30 and 31, the threshold voltages, current collapse, and breakdown voltages were compared on the basis of Sample 32. Fabrication conditions and evaluation results are shown in Table 1 (FIG. 3).

It can be seen from the results in Table 1 that the threshold voltages and current collapse were improved and also the breakdown voltages allowed the good properties within the preferred scope of the present invention.

On the other hand, as for Samples departing from the preferred scope of the invention, some of them had poor properties with respect to at least a part of the threshold voltage and current collapse improvement as well as the breakdown voltage.

In addition, Sample 24 allowed each of the above-mentioned properties to be good, but resistance of the device increased.

Further, since no difference in the properties was seen between Samples 30 and 31, it was confirmed that the difference in the plane direction of the substrate 1 made of a Si single crystal did not influence the properties of the nitride semiconductor substrate 10.

Experiment 4

The film forming temperature for the intermediate layer 3 was changed. Except this, similarly to Sample 1, the nitride semiconductor substrate 10 was fabricated and evaluated. Fabrication conditions and the evaluation results are shown in Table 2 (FIG. 4).

It can be seen from the results in Table 2 that when Sample is outside the scope of the present invention, there is a considerable difference in the threshold voltage especially on the low temperature side compared with Sample within the scope of the present invention. Further, some differences were seen in the current collapse and breakdown voltage.

Experiment 5

In the nitride semiconductor substrate 10 in Sample 1, the AlN spacer layer 6 with a thickness of 1 nm was interposed between the positions shown in FIG. 2. AlN was continuously deposited as a film in the manufacture process in Sample 1, and a growth temperature was set to 1000° C.

When the same evaluation as Sample 1 was performed for this substrate, a shift of the threshold voltage was 4.5V. Accordingly, it can be seen that this is better than that in Sample 1 in respect of the shift of the threshold voltage.

The nitride semiconductor substrate in accordance with the present invention is suitable as a nitride semiconductor substrate used for a nitride semiconductor suitable for an inverter for controlling large current, and a high speed and high breakdown-voltage electron device.

What is claimed is:

1. A nitride semiconductor substrate having a substrate, a buffer layer formed on one principal plane of said substrate, an intermediate layer formed on said buffer layer, an electron transport layer formed on said intermediate layer, and an electron supply layer formed on said electron transport layer, wherein
said intermediate layer has a thickness of 200 nm to 1500 nm and a carbon concentration of $5\times10^{16}$ atoms/cm$^3$ to $1\times10^{18}$ atoms/cm$^3$ and is of $Al_xGa_{1-x}N$ (0.05≤x≤0.24), and said electron transport layer has a thickness of 5 nm to 200 nm and is of $Al_yGa_{1-y}N$ (0≤y≤0.04).

2. The nitride semiconductor substrate as claimed in claim 1, wherein AlN spacer layers are interposed respectively between said intermediate layer and said electron transport layer and between said electron transport layer and said electron supply layer.

3. The nitride semiconductor substrate as claimed in claim 1, wherein said buffer layer comprises an initial buffer layer and repeatedly deposited layers formed on said initial buffer layer,
said initial buffer layer is such that an AlN layer and an $Al_zGa_{1-z}N$ (0≤z≤1) layer are stacked in this order,
said repeatedly deposited layers are such that GaN layers and AlN layer are repeatedly stacked in this order a plurality of times, another GaN layer is further formed to have one set of composite layers, and a plurality of sets are stacked.

4. The nitride semiconductor substrate as claimed in claim 2, wherein said buffer layer comprises an initial buffer layer and repeatedly deposited layers formed on said initial buffer layer,
said initial buffer layer is such that an AlN layer and an $Al_zGa_{1-z}N$ (0≤z≤1) layer are stacked in this order,
said repeatedly deposited layers are such that GaN layers and AlN layer are repeatedly stacked in this order a plurality of times, another GaN layer is further formed to have one set of composite layers, and a plurality of sets are stacked.

5. A method of manufacturing the nitride semiconductor substrate as claimed in claim 1 by way of a vapor deposition process, wherein a temperature at the time of forming said intermediate layer on said buffer layer is from 970° C. to 1250° C.

6. A method of manufacturing the nitride semiconductor substrate as claimed in claim 2 by way of a vapor deposition process, wherein a temperature at the time of forming said intermediate layer on said buffer layer is from 970° C. to 1250° C.

7. A method of manufacturing the nitride semiconductor substrate as claimed in claim 3 by way of a vapor deposition process, wherein a temperature at the time of forming said intermediate layer on said buffer layer is from 970° C. to 1250° C.

8. A method of manufacturing the nitride semiconductor substrate as claimed in claim 4 by way of a vapor deposition process, wherein a temperature at the time of forming said intermediate layer on said buffer layer is from 970° C. to 1250° C.

* * * * *